(12) United States Patent
Tilke

(10) Patent No.: US 7,816,759 B2
(45) Date of Patent: Oct. 19, 2010

(54) INTEGRATED CIRCUIT INCLUDING ISOLATION REGIONS SUBSTANTIALLY THROUGH SUBSTRATE

(75) Inventor: Armin Tilke, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 203 days.

(21) Appl. No.: 11/971,374

(22) Filed: Jan. 9, 2008

(65) Prior Publication Data

US 2009/0174027 A1   Jul. 9, 2009

(51) Int. Cl.
H01L 29/00 (2006.01)
H01L 21/76 (2006.01)

(52) U.S. Cl. .............. 257/506; 257/513; 257/532; 257/E21.008; 257/E23.002; 257/E29.343

(58) Field of Classification Search .......... 257/506, 257/532, 513, E21.546, E21.008, E23.002
See application file for complete search history.

(56) References Cited

U.S. PATENT DOCUMENTS

| | | | |
|---|---|---|---|
| 5,349,224 A | 9/1994 | Gilbert et al. | |
| 5,445,988 A | 8/1995 | Schwalke | |
| 5,449,946 A * | 9/1995 | Sakakibara et al. | 257/487 |
| 5,496,765 A | 3/1996 | Schwalke | |
| 5,592,015 A * | 1/1997 | Iida et al. | 257/524 |
| 6,084,264 A | 7/2000 | Darwish | |
| 6,413,836 B1 * | 7/2002 | Tseng | 438/424 |
| 6,559,035 B2 | 5/2003 | Villa et al. | |
| 6,635,544 B2 | 10/2003 | Disney | |
| 6,642,599 B1 | 11/2003 | Watabe et al. | |
| 6,667,226 B2 | 12/2003 | Pinto et al. | |
| 7,001,806 B2 | 2/2006 | Tilke et al. | |
| 7,078,315 B2 * | 7/2006 | Chang et al. | 438/435 |
| 2006/0267134 A1 | 11/2006 | Tilke et al. | |
| 2007/0298593 A1 * | 12/2007 | Yu et al. | 438/479 |

* cited by examiner

*Primary Examiner*—David S Blum
(74) *Attorney, Agent, or Firm*—Dicke, Billig & Czaja, PLLC

(57) ABSTRACT

An integrated circuit including a substrate and trench isolation regions. The substrate supports a device. The trench isolation regions are configured to laterally isolate the device. The trench isolation regions extend substantially through the substrate.

18 Claims, 5 Drawing Sheets

INTEGRATED CIRCUIT INCLUDING ISOLATION REGIONS SUBSTANTIALLY THROUGH SUBSTRATE

BACKGROUND

Smart power integrated circuit technology has evolved to where entire electronic systems are built into a single integrated circuit chip. The single chip combines analog, digital, and power functions to provide system functions. The single chip replaces multiple integrated circuit chips and enables manufacturers to build smaller systems. Applications include systems in the automotive, industrial, telecommunication, and data processing fields. The single chip can be manufactured via a bipolar, complementary metal oxide semiconductor (CMOS), double-diffused metal oxide semiconductor (DMOS) process, referred to as a BCD process.

Typically, smart power electronics are manufactured via either conventional bulk silicon substrates or silicon-on-insulator (SOI) substrates. The SOI substrates contain a buried oxide layer that is about 0.1-1 micrometer (μm) thick and 1-5 μm under the surface of the chip.

Usually, in bulk silicon a p-type substrate is used and an n-plus buried layer is situated between the p-type substrate and an n-type epitaxial layer. The n-plus buried layer is contacted via a sinker diffusion contact. Device isolation is provided via trench isolation regions and the highly doped n-plus buried layer. The trench isolation regions also serve to contact the p-type substrate that would otherwise be floating. Bulk silicon substrates are less expensive than SOI substrates. However, the sinker diffusion contact is expensive and consumes area on the chip. Also, device isolation is not complete such that devices are not completely isolated from one another.

SOI provides complete dielectric isolation of devices that are laterally isolated via trench regions and vertically isolated via the buried oxide layer. However, SOI substrates are expensive in comparison to bulk silicon substrates. In addition, the high thermal resistance of the oxide layer prevents heat from flowing away from the power devices, which can lead to degraded performance of the power devices.

For these and other reasons there is a need for the present invention.

SUMMARY

One embodiment described in the disclosure provides an integrated circuit including a substrate and trench isolation regions. The substrate supports a device. The trench isolation regions are configured to laterally isolate the device. The trench isolation regions extend substantially through the substrate.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
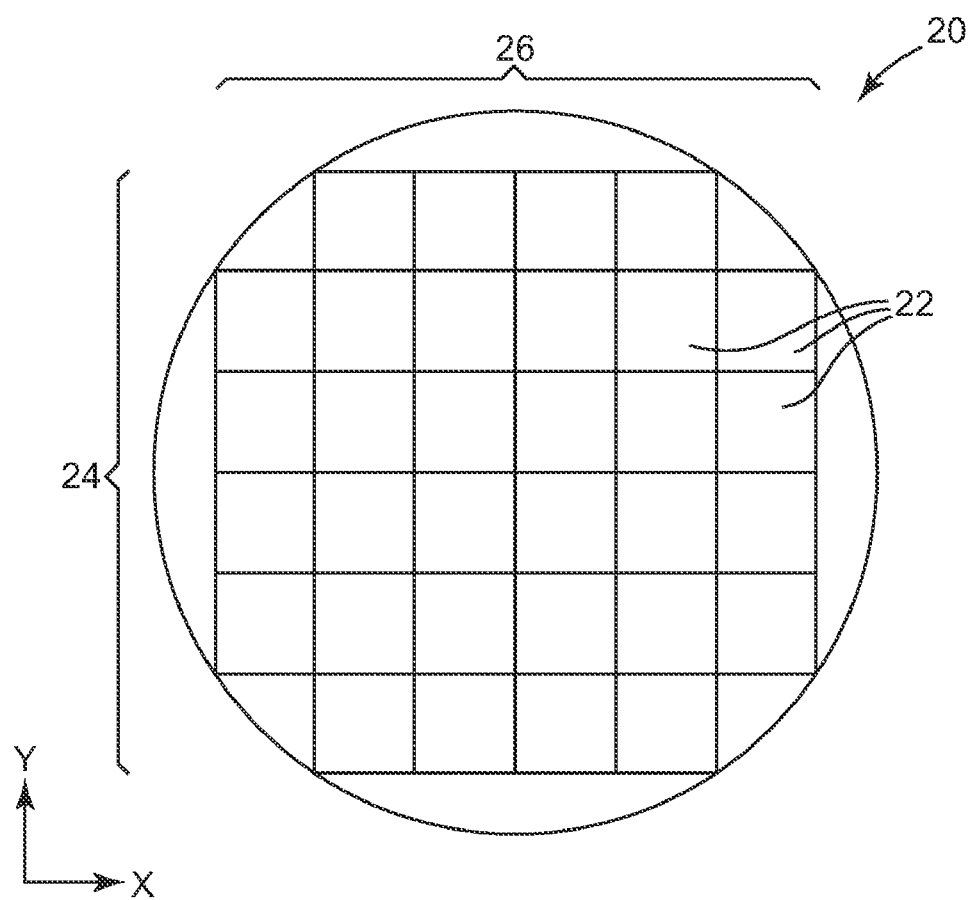
FIG. 1 is a diagram illustrating one embodiment of a semiconductor wafer.

FIG. 1 is a diagram illustrating one embodiment of a semiconductor wafer 20. Wafer 20 is a bulk silicon wafer that includes integrated circuit chips 22. The integrated circuits 22 are arranged in rows 24 in the x-direction and columns 26 in the y-direction. In one embodiment, wafer 20 is manufactured via a BCD process. In one embodiment, each of the integrated circuits 22 is a smart power integrated circuit. In one embodiment, wafer 20 is manufactured via a CMOS process. In one embodiment, each of the integrated circuits 22 is a memory. In one embodiment, each of the integrated circuits 22 is a dynamic random access memory (DRAM). In one embodiment, each of the integrated circuits 22 is a flash memory. In one embodiment, each of the integrated circuits 22 includes an electronic system that combines analog, digital, and power functions to provide system functions.

Wafer 20 and the integrated circuits 22 include a substrate that supports devices, such as bipolar devices, CMOS devices, and DMOS devices. Deep trench isolation regions are formed in the substrate for lateral isolation of the devices. In one embodiment, the deep trench isolation regions are etched substantially through the substrate to laterally isolate the devices.

After wafer 20 has completed processing to provide the devices in integrated circuits 22, wafer 20 is backside polished until reaching the deep trench isolation regions. A dielectric, such as nitride, is deposited on the polished backside to vertically isolate the devices and insulate the backside of the integrated circuits 22. Wafer 20 is diced to provide individual integrated circuit chips 22. In one embodiment, wafer 20 and the integrated circuits 22 include an n-plus substrate that supports and contacts an n-type epitaxial layer.

In other embodiments, wafer 20 and the integrated circuits 22 can include a p-type substrate without buried layers or epitaxial layers.

In one embodiment, wafer 20 and the integrated circuits 22 include an n-type substrate that supports an n-plus buried layer and an n-type epitaxial layer. The n-plus buried layer is situated between and in contact with the n-type substrate and the n-type epitaxial layer. Deep trench isolation regions are etched substantially from the n-type epitaxial layer through the n-type substrate. The deep trench isolation regions laterally isolate devices in the n-type epitaxial layer. A dielectric, such as nitride or silicon dioxide, is deposited on the polished backside to vertically isolate the devices and insulate the backside of the integrated circuits 22. Wafer 20 is diced to provide individual integrated circuit chips 22.

In one embodiment, wafer 20 and the integrated circuits 22 include a p-type substrate that supports an n-plus buried layer and a p-type or n-type epitaxial layer. The n-plus buried layer is situated between and in contact with the p-type substrate and the epitaxial layer. Deep trench isolation regions are etched substantially from the epitaxial layer through the p-type substrate. The deep trench isolation regions laterally isolate devices in the epitaxial layer. A dielectric, such as nitride or silicon dioxide, is deposited on the polished backside to vertically isolate the devices and insulate the backside of the integrated circuits 22. Wafer 20 is diced to provide individual integrated circuit chips 22.

If wafer 20 and the integrated circuits 22 include an n-plus buried layer, the n-plus buried layer can be contacted in different ways. In one embodiment, sinker diffusions extend through the n-type epitaxial layer to contact the n-plus buried layer. In one embodiment, sinker diffusions are implanted via a photo-resist mask and then driven-out, i.e. out-diffused, in a furnace anneal to contact the n-plus buried layer. In one embodiment, the deep trench isolation regions include n-doped dielectric liners that are driven-out into the silicon to provide contacts to the n-plus buried layer. In one embodiment, the deep trench isolation regions include n-plus poly-silicon liners that are driven-out into the silicon to provide contacts to the n-plus buried layer.

In wafer 20 and the integrated circuits 22, the deep trench isolation regions and backside dielectric provide complete isolation of devices in bulk silicon. The backside dielectric can have a lower thermic resistance than the oxide layer in SOI and heat-flow away from high power devices is improved as compared to SOI. In addition, the bulk silicon wafers are cheaper than SOI wafers.

Figure 2:
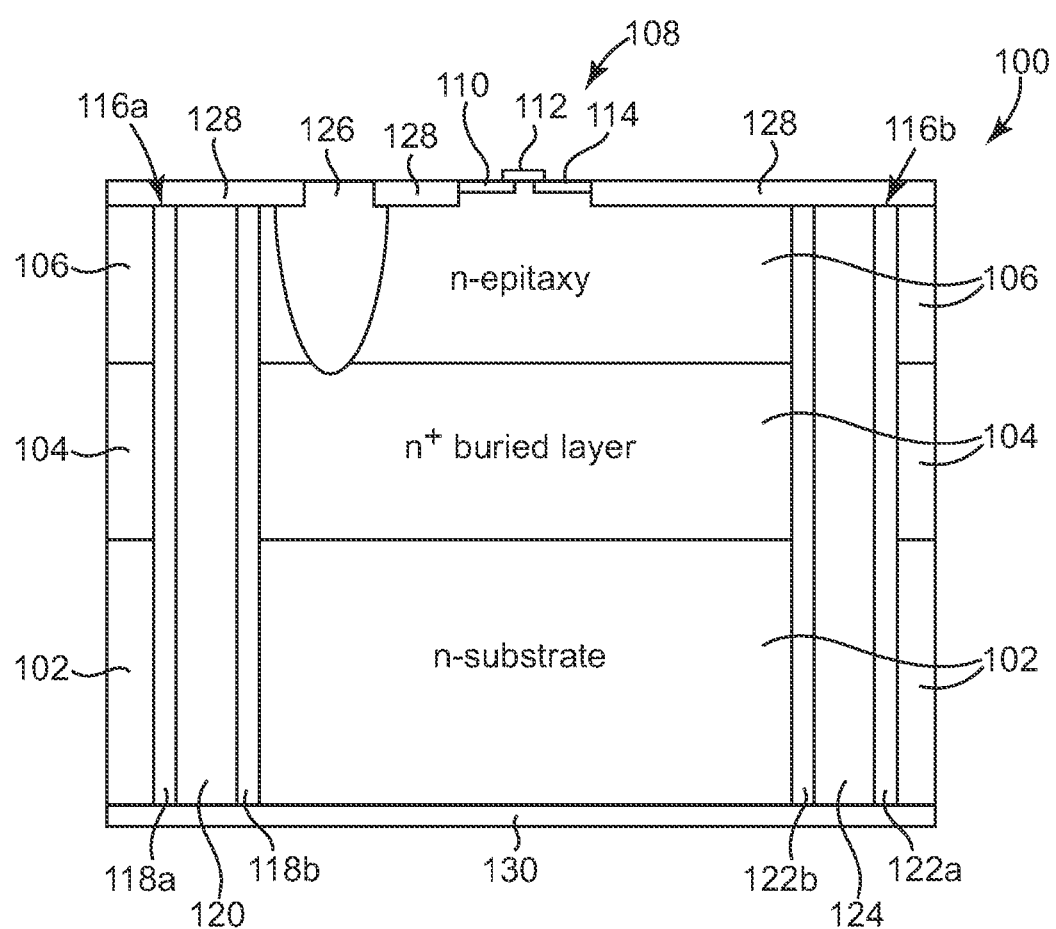
FIG. 2 is a diagram illustrating one embodiment of an integrated circuit portion.

FIG. 2 is a diagram illustrating one embodiment of an integrated circuit portion 100 of one of the integrated circuits 22. Portion 100 includes an n-type substrate 102, an n-plus buried layer 104, and an n-type epitaxial layer 106. The n-type substrate 102 supports the n-plus buried layer 104 and the n-type epitaxial layer 106. The n-type substrate 102 is situated underneath and in contact with the n-plus buried layer 104 and the n-plus buried layer 104 is situated underneath and in contact with the n-type epitaxial layer 106. In one embodiment, n-type substrate 102 is an n-minus substrate. In one embodiment, n-type substrate 102 is about 100 um deep. In one embodiment, n-plus buried layer 104 is about 6 um deep. In one embodiment, n-type epitaxial layer 106 is about 5 um deep.

In other embodiments, integrated circuit portion 100 includes n-type substrate 102, n-plus buried layer 104, and a p-type epitaxial layer (instead of n-type epitaxial layer 106). The rest of portion 100 is the same as illustrated in FIG. 2.

Portion 100 includes a device at 108. Device 108 includes a source 110, a gate 112, and a drain 114 situated in n-type epitaxial layer 106. Device 108 is a metal oxide semiconductor field effect transistor (MOSFET). In one embodiment, device 108 is part of an analog circuit. In one embodiment, device 108 is part of a digital circuit. In one embodiment, device 108 is part of a power circuit.

In other embodiments, device 108 can be another suitable device. In one embodiment, device 108 is a smart power device. In one embodiment, device 108 is a bipolar junction device, such as a transistor or a diode. In one embodiment, device 108 is a CMOS device. In one embodiment, device 108 is a DMOS device. In one embodiment, device 108 is part of a memory, such as a DRAM or a flash memory.

Portion 100 includes deep trench isolation regions 116a and 116b that extend from n-type epitaxial layer 106, through n-plus buried layer 104 and substantially through n-type substrate 102. Deep trench isolation region 116a includes insulating liners at 118a and 118b and filler material at 120. Insulating liners 118a and 118b line deep trench isolation region 116a. Deep trench isolation region 116b includes insulating liners at 122a and 122b and filler material at 124. Insulating liners 122a and 122b line deep trench isolation region 116b. Insulating liners 118a and 118b and insulating liners 122a and 122b laterally isolate device 108 from other devices in integrated circuit 22. In one embodiment, deep trench isolation regions 116a and 116b are part of a deep trench isolation ring that laterally surrounds device 108. In one embodiment, deep trench isolation regions 116a and 116b are about 3 um wide. In one embodiment, insulating liners 118a and 118b and insulating liners 122a and 122b are oxide layers. In one embodiment, filler material at 120 and 124 is poly-silicon. In one embodiment, filler material at 120 and 124 includes carbon. In one embodiment, filler material at 120 and 124 includes silicide. Portion 100 includes an n-type sinker 126, a surface layer 128, and a backside insulating layer 130. N-type sinker 126 contacts n-plus buried layer 104 and surface layer 128 is situated on portions of n-type epitaxial layer 106, deep trench isolation regions 116a and 116b, and n-type sinker 126. In one embodiment, n-type sinker 126 is implanted via a photo-resist mask and driven-out, i.e. out diffused, via a furnace anneal. In one embodiment, surface layer 128 is an insulating layer. In one embodiment, surface layer 128 is a field oxide. In one embodiment, surface layer 128 is deposited oxide. In one embodiment, local oxidation of silicon (LOCOS) is used for isolation purposes. In one embodiment, shallow trench isolation (STI), such as a shallow trench filled with silicon dioxide, is used for isolation purposes.

Backside insulating layer 130 is situated underneath and in contact with n-type substrate 102 and deep trench isolation regions 116a and 116b. Backside insulating layer 130 is a dielectric. In one embodiment backside insulating layer 130 is a nitride. In one embodiment, wafer 20 is backside polished to reach deep trench isolation regions 116a and 116b and backside insulating layer 130 is put on after the backside polish. In one embodiment, wafer 20 is backside polished via a chemical mechanical polish.

Deep trench isolation regions 116a and 116b and backside insulating layer 130 provide complete isolation of device 108 from other devices in integrated circuit 22. Backside insulating layer 130 has a lower thermic resistance than the oxide layer in an SOI wafer and heat-flow away from devices is improved as compared to in the SOI wafer. In addition, bulk silicon wafers including n-type substrate 102 are cheaper than SOI wafers.

Figure 3:
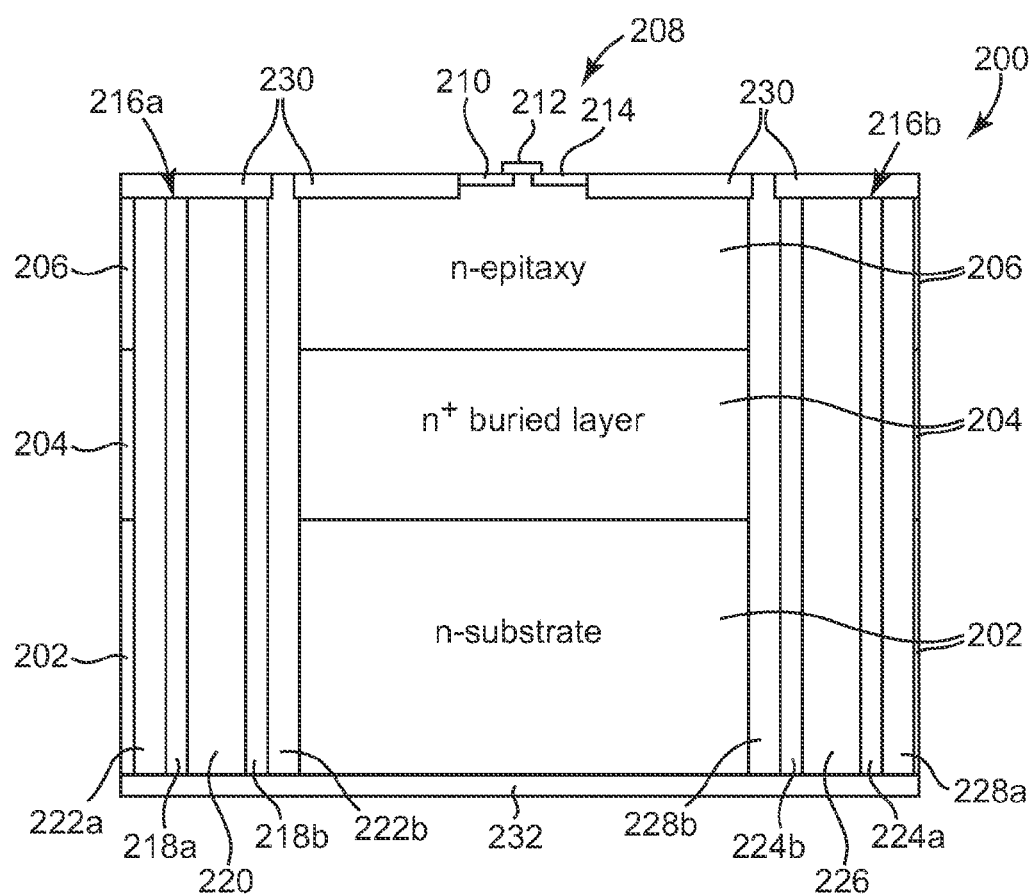
FIG. 3 is a diagram illustrating one embodiment of an integrated circuit portion that includes sinker contacts provided via trench liners.

FIG. 3 is a diagram illustrating one embodiment of an integrated circuit portion 200 that includes sinker contacts provided via trench liners. Portion 200 is part of an integrated circuit, such as one of the integrated circuits 22.

Portion 200 includes an n-type substrate 202, an n-plus buried layer 204, and an n-type epitaxial layer 206. The n-type substrate 202 supports the n-plus buried layer 204 and the n-type epitaxial layer 206. The n-type substrate 202 is situated underneath and in contact with the n-plus buried layer 204 and the n-plus buried layer 204 is situated underneath and in contact with the n-type epitaxial layer 206. In one embodiment, n-type substrate 202 is an n-minus substrate. In one embodiment, n-type substrate 202 is about 100 um deep. In one embodiment, n-plus buried layer 204 is about 6 um deep. In one embodiment, n-type epitaxial layer 206 is about 5 um deep.

Portion 200 includes a device at 208. Device 208 includes a source 210, a gate 212, and a drain 214 situated in n-type epitaxial layer 206. Device 208 is a MOSFET. In one embodiment, device 208 is part of an analog circuit. In one embodiment, device 208 is part of a digital circuit. In one embodiment, device 208 is part of a power circuit.

In other embodiments, device 208 can be another suitable device. In one embodiment, device 208 is a smart power device. In one embodiment, device 208 is a bipolar junction device, such as a transistor or a diode. In one embodiment, device 208 is a CMOS device. In one embodiment, device 208 is a DMOS device.

Portion 200 includes deep trench isolation regions 216a and 216b that extend from n-type epitaxial layer 206, through n-plus buried layer 204 and substantially through n-type substrate 202. In one embodiment, deep trench isolation regions 216a and 216b are part of a deep trench isolation ring that laterally surrounds device 208. In one embodiment, deep trench isolation regions 216a and 216b are about 3 um wide.

Deep trench isolation region 216a includes insulating liners at 218a and 218b, filler material at 220, and n-type liner regions at 222a and 222b. Insulating liners 218a and 218b are dielectric liners. N-type liner regions 222a and 222b line surface sidewalls of deep trench isolation region 216a. In one embodiment, insulating liners 218a and 218b are silicon dioxide liners. In one embodiment, the filler material at 220 is poly-silicon. In one embodiment, filler material at 220 includes carbon. In one embodiment, filler material at 220 includes silicide.

N-type liner regions 222a and 222b are manufactured by putting down n-doped dielectric liners. The n-doped dielectric liners are driven-out, i.e. out-diffused, to provide n-type liner regions 222a and 222b. The remaining driven-out n-doped dielectric liners are insulating liners 218a and 218b. In one embodiment, highly-doped n-type oxide, such as phosphor silicate glass (PSG), is put down and out-diffused via a furnace anneal to provide n-type liner regions 222a and 222b. In one embodiment, the driven-out n-doped dielectric liners are sacrificial liners that are stripped out and un-doped oxide is put down to become insulating liners 218a and 218b.

Deep trench isolation region 216b includes insulating liners at 224a and 224b, filler material at 226, and n-type liner regions 228a and 228b. Insulating liners 224a and 224b are dielectric liners. N-type liner regions 228a and 228b line surface sidewalls of deep trench isolation region 216b. In one embodiment, insulating liners 224a and 224b are silicon dioxide liners. In one embodiment, the filler material at 226 is poly-silicon. In one embodiment, filler material at 226 includes carbon. In one embodiment, filler material at 226 includes silicide.

N-type liner regions 228a and 228b are manufactured by putting down n-doped dielectric liners. The n-doped dielectric liners are driven-out, i.e. out-diffused, to provide n-type liner regions 228a and 228b. The remaining driven-out n-doped dielectric liners are insulating liners 224a and 224b. In one embodiment, highly-doped n-type oxide, such as PSG, is put down and out-diffused via a furnace anneal to provide n-type liner regions 228a and 228b. In one embodiment, the driven-out n-doped dielectric liners are sacrificial liners that are stripped out and un-doped oxide is put down to become insulating liners 224a and 224b.

Insulating liners 218a and 218b and insulating liners 224a and 224b laterally isolate device 208 from other devices in the integrated circuit. N-type liner regions 222b and 228b are used to electrically contact n-plus buried layer 204 underneath device 208. Using n-type liner regions 222b and 228b to electrically contact n-plus buried layer 204, precludes the need for a dedicated sinker photo-mask. In one embodiment, n-type liner regions 222b and 228b are part of an n-type sinker ring that laterally surrounds device 208.

Portion 200 includes a surface layer 230 and a backside insulating layer 232. Surface layer 230 is situated on portions of n-type epitaxial layer 206 and deep trench isolation regions 216a and 216b. N-type liner regions 222b and 228b extend through surface layer 230 for electrically contacting n-plus buried layer 204. In one embodiment, surface layer 230 is an insulating oxide layer. In one embodiment, surface layer 230 is a field oxide. In one embodiment, surface layer 230 is deposited oxide. In one embodiment, local oxidation of silicon (LOCOS) is used for isolation purposes. In one embodiment, shallow trench isolation (STI), such as a shallow trench filled with silicon dioxide, is used for isolation purposes. Backside insulating layer 232 is situated underneath and in contact with n-type substrate 202 and deep trench isolation regions 216a and 216b. Backside insulating layer 232 is a dielectric. In one embodiment backside insulating layer 232 is a nitride. In one embodiment, wafer 20 is backside polished to reach deep trench isolation regions 216a and 216b and backside insulating layer 232 is put on after the backside polish. In one embodiment, wafer 20 is backside polished via a chemical mechanical polish.

Deep trench isolation regions 216a and 216b and backside insulating layer 232 provide complete isolation of device 208 from other devices in integrated circuit. N-type liner regions 222b and 228b provide electrical contact to n-plus buried layer 204, which precludes the need for a dedicated sinker photo-mask. Backside insulating layer 232 has a lower thermic resistance than the oxide layer in an SOI wafer and heat-flow away from devices is improved as compared to in the SOI wafer. In addition, bulk silicon wafers including n-type substrate 202 are cheaper than SOI wafers.

Figure 4:
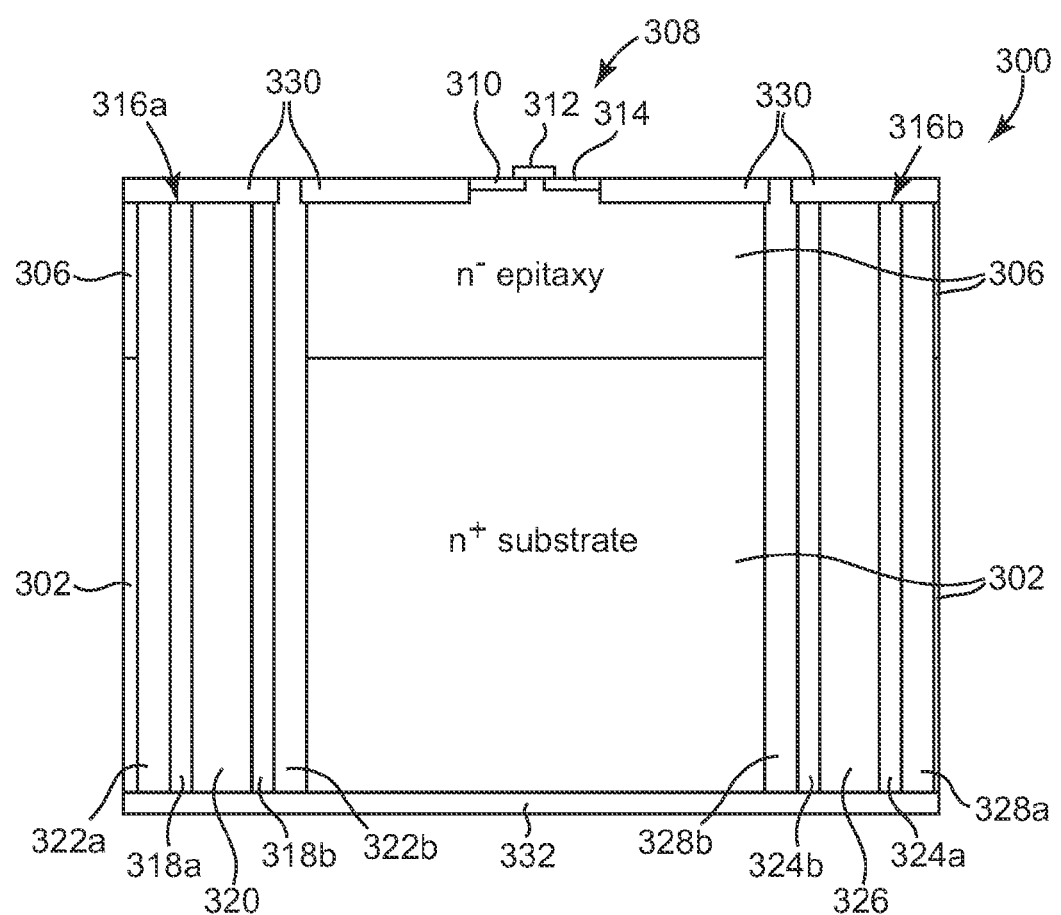
FIG. 4 is a diagram illustrating one embodiment of an integrated circuit portion that includes an N-plus substrate and an N-minus epitaxial layer.

FIG. 4 is a diagram illustrating one embodiment of an integrated circuit portion 300 that includes an n-plus substrate 302 and an n-minus epitaxial layer 306. Portion 300 is part of an integrated circuit, such as one of the integrated circuits 22. Portion 300 is similar to portion 200 of FIG. 2, except portion 300 includes only an n-plus substrate 302 where portion 200 includes an n-plus buried layer 204 and an n-type substrate 202.

In other embodiments, integrated circuit portion 300 includes a p-plus substrate and a p-minus epitaxial layer, instead of n-plus substrate 302 and n-minus epitaxial layer 306. The rest of portion 300 is the same as illustrated in FIG. 4.

Portion 300 includes n-plus substrate 302 and n-minus epitaxial layer 306. N-plus substrate 302 supports the n-minus epitaxial layer 306, where the n-plus substrate 302 is situated underneath and in contact with the n-minus epitaxial layer 306. In one embodiment, n-plus substrate 302 is about 100 um deep. In one embodiment, n-minus epitaxial layer 306 is about 5 um deep.

Portion 300 includes a device at 308 that includes a source 310, a gate 312, and a drain 314 situated in n-minus epitaxial layer 306. Device 308 is a MOSFET. In one embodiment, device 308 is part of an analog circuit. In one embodiment, device 308 is part of a digital circuit. In one embodiment, device 308 is part of a power circuit.

In other embodiments, device 308 can be another suitable device. In one embodiment, device 308 is a smart power device. In one embodiment, device 308 is a bipolar junction device, such as a transistor or a diode. In one embodiment, device 308 is a CMOS device. In one embodiment, device 308 is a DMOS device.

Portion 300 includes deep trench isolation regions 316a and 316b that extend from n-minus epitaxial layer 306 substantially through n-plus substrate 302. In one embodiment, deep trench isolation regions 316a and 316b are part of a deep trench isolation ring that laterally surrounds device 308. In one embodiment, deep trench isolation regions 316a and 316b are about 3 um wide.

Deep trench isolation region 316a includes insulating liners at 318a and 318b, filler material at 320, and n-type liner regions at 322a and 322b. Insulating liners 318a and 318b are dielectric liners. N-type liner regions 322a and 322b line surface sidewalls of deep trench isolation region 316a. In one embodiment, insulating liners 318a and 318b are silicon dioxide liners. In one embodiment, the filler material at 320 is poly-silicon. In one embodiment, filler material at 320 includes carbon. In one embodiment, filler material at 320 includes silicide.

N-type liner regions 322a and 322b are manufactured by putting down n-doped dielectric liners. The n-doped dielectric liners are driven-out, i.e. out-diffused, to provide n-type liner regions 322a and 322b. The remaining driven-out n-doped dielectric liners are insulating liners 318a and 318b. In one embodiment, highly-doped n-type oxide, such as PSG, is put down and out-diffused via a furnace anneal to provide n-type liner regions 322a and 322b. In one embodiment, the driven-out n-doped dielectric liners are sacrificial liners that are stripped out and un-doped oxide is put down to become insulating liners 318a and 318b.

Deep trench isolation region 316b includes insulating liners at 324a and 324b, filler material at 326, and n-type liner regions 328a and 328b. Insulating liners 324a and 324b are dielectric liners. N-type liner regions 328a and 328b line surface sidewalls of deep trench isolation region 316b. In one embodiment, insulating liners 324a and 324b are silicon dioxide liners. In one embodiment, the filler material at 326 is poly-silicon. In one embodiment, filler material at 326 includes carbon. In one embodiment, filler material at 326 includes silicide.

N-type liner regions 328a and 328b are manufactured by putting down n-doped dielectric liners. The n-doped dielectric liners are driven-out, i.e. out-diffused, to provide n-type liner regions 328a and 328b. The remaining driven-out n-doped dielectric liners are insulating liners 324a and 324b. In one embodiment, highly-doped n-type oxide, such as PSG, is put down and out-diffused via a furnace anneal to provide n-type liner regions 328a and 328b. In one embodiment, the driven-out n-doped dielectric liners are sacrificial liners that are stripped out and un-doped oxide is put down to become insulating liners 324a and 324b.

Insulating liners 318a and 318b and insulating liners 324a and 324b laterally isolate device 308 from other devices in the integrated circuit. N-type liner regions 322b and 328b are used to electrically contact n-plus substrate 302 underneath device 308. Using n-type liner regions 322b and 328b to electrically contact n-plus substrate 302, precludes the need for a dedicated sinker photo-mask. In one embodiment, n-type liner regions 322b and 328b are part of an n-type sinker ring that laterally surrounds device 308.

Portion 300 includes a surface layer 330 and a backside insulating layer 332. Surface layer 330 is situated on portions of n-type epitaxial layer 306 and deep trench isolation regions 316a and 316b. N-type liner regions 322b and 328b extend through surface layer 330 for electrically contacting n-plus substrate 302. In one embodiment, surface layer 330 is an insulating oxide layer. In one embodiment, surface layer 330 is a field oxide. In one embodiment, surface layer 330 is deposited oxide. In one embodiment, local oxidation of silicon (LOCOS) is used for isolation purposes. In one embodiment, shallow trench isolation (STI), such as a shallow trench filled with silicon dioxide, is used for isolation purposes.

Backside insulating layer 332 is situated underneath and in contact with n-plus substrate 302 and deep trench isolation regions 316a and 316b. Backside insulating layer 332 is a dielectric. In one embodiment backside insulating layer 332 is a nitride. In one embodiment, wafer 20 is backside polished to reach deep trench isolation regions 316a and 316b and backside insulating layer 332 is put on after the backside polish. In one embodiment, wafer 20 is backside polished via a chemical mechanical polish.

Deep trench isolation regions 316a and 316b and backside insulating layer 332 provide complete isolation of device 308 from other devices in the integrated circuit. N-type liner regions 322b and 328b provide electrical contact to n-plus substrate 302, which precludes the need for a dedicated sinker photo-mask. Backside insulating layer 332 has a lower thermic resistance than the oxide layer in an SOI wafer and heat-flow away from devices is improved as compared to in the SOI wafer. In addition, bulk silicon wafers including n-plus substrate 302 are cheaper than SOI wafers.

Figure 5:
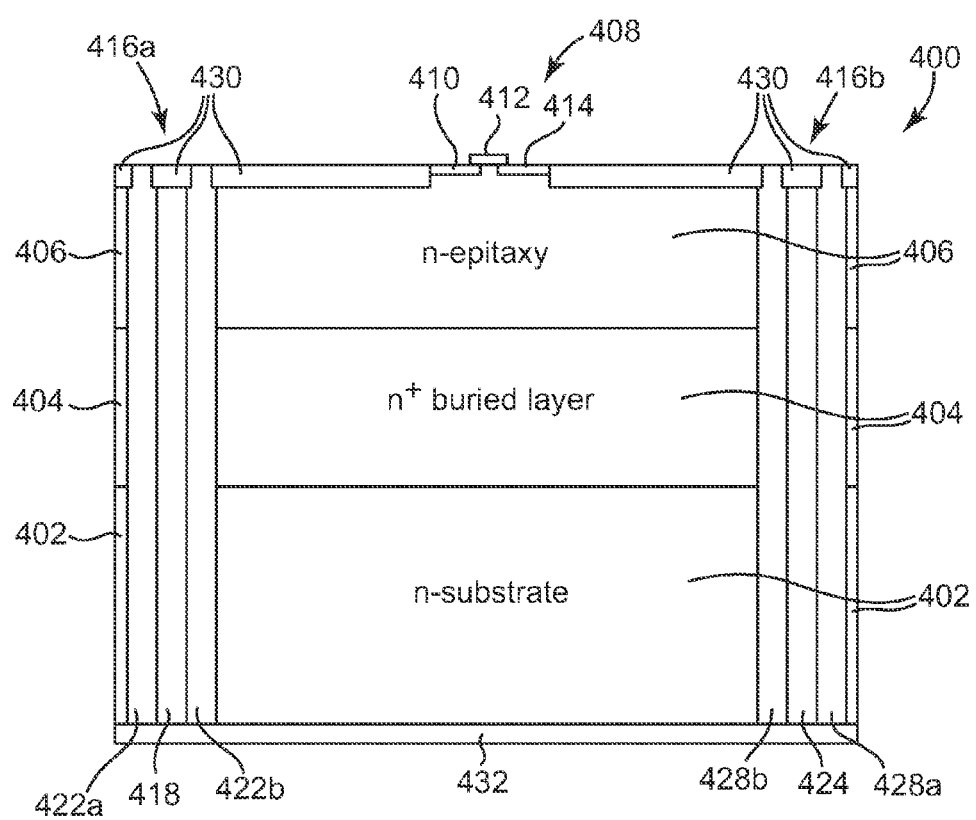
FIG. 5 is a diagram illustrating one embodiment of an integrated circuit portion that includes sinker contacts.

FIG. 5 is a diagram illustrating one embodiment of an integrated circuit portion 400 that includes sinker contacts. Portion 400 is part of an integrated circuit, such as one of the integrated circuits 22.

Portion 400 includes an n-type substrate 402, an n-plus buried layer 404, and an n-type epitaxial layer 406. The n-type substrate 402 supports the n-plus buried layer 404 and the n-type epitaxial layer 406. The n-type substrate 402 is situated underneath and in contact with the n-plus buried layer 404 and the n-plus buried layer 404 is situated underneath and in contact with the n-type epitaxial layer 406. In one embodiment, n-type substrate 402 is an n-minus substrate. In one embodiment, n-type substrate 402 is about 100 um deep. In one embodiment, n-plus buried layer 404 is about 6 um deep. In one embodiment, n-type epitaxial layer 406 is about 5 um deep.

Portion 400 includes a device at 408. Device 408 includes a source 410, a gate 412, and a drain 414 situated in n-type epitaxial layer 406. Device 408 is a MOSFET. In one embodiment, device 408 is part of an analog circuit. In one embodiment, device 408 is part of a digital circuit. In one embodiment, device 408 is part of a power circuit.

In other embodiments, device 408 can be another suitable device. In one embodiment, device 408 is a smart power device. In one embodiment, device 408 is a bipolar junction device, such as a transistor or a diode. In one embodiment, device 408 is a CMOS device. In one embodiment, device 408 is a DMOS device.

Portion 400 includes deep trench isolation regions 416a and 416b that extend from n-type epitaxial layer 406, through n-plus buried layer 404 and substantially through n-type substrate 402. In one embodiment, deep trench isolation regions 416a and 416b are part of a deep trench isolation ring that laterally surrounds device 408. In one embodiment, deep trench isolation regions 416a and 416b are about 3 um wide.

Deep trench isolation region 416a includes insulating material at 418 and sinker contact liner regions at 422a and 422b. Insulating material 418 is a dielectric and liner regions 422a and 422b are a conductive material, such as n-plus poly-silicon, carbon, or silicide. Liner regions 422a and 422b line surface sidewalls of deep trench isolation region 416a. Deep trench isolation region 416a is manufactured via depositing liner regions 422a and 422b and filling with insulating material 418. In one embodiment, liner regions 422a and 422b are driven-out, i.e. out-diffused, into n-type epitaxial layer 406, n-plus buried layer 404, and n-type substrate 402. In one embodiment, insulating material 418 is silicon dioxide.

Deep trench isolation region 416b includes insulating material at 424 and sinker contact liner regions at 428a and 428b. Insulating material 424 is a dielectric and liner regions 428a and 428b are a conductive material, such as n-plus poly-silicon, carbon, or silicide. Liner regions 428a and 428b line surface sidewalls of deep trench isolation region 416b. Deep trench isolation region 416b is manufactured via depositing liner regions 428a and 428b and filling with insulating material 424. In one embodiment, liner regions 428a and 428b are driven-out, i.e. out-diffused, into n-type epitaxial layer 406, n-plus buried layer 404, and n-type substrate 402. In one embodiment, insulating material 424 is silicon dioxide.

Insulating material at 418 and 424 laterally isolates device 408 from other devices in the integrated circuit. Liner regions 422b and 428b are used to electrically contact n-plus buried layer 404 underneath device 408. Using liner regions 422b and 428b to electrically contact n-plus buried layer 404, precludes the need for a dedicated sinker photo-mask. In one embodiment, liner regions 422b and 428b are part of a sinker ring that laterally surrounds device 408. In one embodiment, each of the devices in the integrated circuit has a sinker ring that laterally surrounds it.

Portion 400 includes a surface layer 430 and a backside insulating layer 432. Surface layer 430 is situated on portions of n-type epitaxial layer 406 and deep trench isolation regions 416a and 416b. Liner regions 422a, 422b, 428a, and 428b extend through surface layer 430 for electrically contacting n-plus buried layer 404. In one embodiment, surface layer 430 is an insulating oxide layer. In one embodiment, surface layer 430 is a field oxide. In one embodiment, surface layer 430 is deposited oxide. In one embodiment, local oxidation of silicon (LOCOS) is used for isolation purposes. In one embodiment, shallow trench isolation (STI), such as a shallow trench filled with silicon dioxide, is used for isolation purposes.

Backside insulating layer 432 is situated underneath and in contact with n-type substrate 402 and deep trench isolation regions 416a and 416b. Backside insulating layer 432 is a dielectric. In one embodiment backside insulating layer 432 is a nitride. In one embodiment, wafer 20 is backside polished to reach deep trench isolation regions 416a and 416b and backside insulating layer 432 is put on after the backside polish. In one embodiment, wafer 20 is backside polished via a chemical mechanical polish.

Deep trench isolation regions 416a and 416b and backside insulating layer 432 provide complete isolation of device 408 from other devices in integrated circuit. Liner regions 422b and 428b provide electrical contact to n-plus buried layer 404, which precludes the need for a dedicated sinker photo-mask. Backside insulating layer 432 has a lower thermic resistance than the oxide layer in an SOI wafer and heat-flow away from devices is improved as compared to in the SOI wafer. In addition, bulk silicon wafers including n-type substrate 402 are cheaper than SOI wafers.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a substrate that supports a device; and
a trench isolation region configured to laterally isolate the device, wherein the trench isolation region extends substantially through the substrate and comprises:
a liner region in contact with the substrate and lining a sidewall surface of the trench isolation region, wherein the liner region extends substantially through the substrate and has a higher doping concentration than the substrate.

2. The integrated circuit of claim 1, comprising:
a polished backside including the substrate and the trench isolation region.

3. The integrated circuit of claim 1, comprising:
a backside; and
an insulator situated on the backside, wherein the insulator is situated on the substrate and the trench isolation region.

4. The integrated circuit of claim 3, wherein the insulator is a nitride dielectric.

5. The integrated circuit of claim 1, comprising:
an epitaxial layer over the substrate, wherein the trench isolation region extends substantially from the epitaxial layer through the substrate.

6. The integrated circuit of claim 1, comprising:
an epitaxial layer in contact with the substrate, wherein the substrate is one of an n-plus substrate and a p-plus substrate.

7. The integrated circuit of claim 1, comprising:
an epitaxial layer; and
a buried layer between the substrate and the epitaxial layer.

8. The integrated circuit of claim 1, wherein the integrated circuit is part of a semiconductor wafer.

9. An integrated circuit comprising:
a backside dielectric layer;
an n-minus substrate layer on the backside dielectric layer;
an n-plus buried layer on the n-minus substrate layer and separated from the backside dielectric layer via the n-minus substrate layer;
an epitaxial layer on the n-plus buried layer and separated from the n-minus substrate layer via the n-plus buried layer; and
a deep trench isolation region configured to laterally isolate at least one device in the epitaxial layer and extending to the backside dielectric layer.

10. The integrated circuit of claim 9, comprising:
a sinker configured to extend through the epitaxial layer and contact the n-plus buried layer.

11. The integrated circuit of claim 9, wherein the deep trench isolation region comprises:
an n-doped dielectric liner.

12. The integrated circuit of claim 11, wherein the deep trench isolation region comprises a liner region lining a sidewall surface of the deep trench isolation region and extending substantially through the n-minus substrate layer, the n-plus buried layer, and the epitaxial layer, wherein the liner region includes electrons from the n-doped dielectric liner.

13. The integrated circuit of claim 9, wherein the deep trench isolation region comprises one of:
an n-plus polysilicon liner, carbon, and silicide.

14. The integrated circuit of claim 13, wherein the deep trench isolation region comprises a liner region lining a sidewall surface of the deep trench isolation region and extending substantially through the n-minus substrate layer, the n-plus buried layer, and the epitaxial layer, wherein the liner region includes electrons from the n-plus polysilicon liner.

15. An integrated circuit comprising:
a substrate that supports a device; and
a deep trench isolation region extending through the substrate and comprising an n-plus liner in contact with the substrate, wherein the n-plus liner lines a sidewall surface of the deep trench isolation region and extends through the substrate.

16. The integrated circuit of claim 9, comprising:
a polished backside including the n-minus substrate layer and the deep trench isolation region.

17. An integrated circuit comprising:
an n-minus substrate;
an n-plus buried layer on the n-minus substrate;
an epitaxial layer on the n-plus buried layer; and
a deep trench isolation region configured to laterally isolate at least one device in the epitaxial layer, wherein the deep trench isolation region comprises:
a liner region lining a sidewall surface of the deep trench isolation region and extending substantially through the n-minus substrate layer, the n-plus buried layer, and the epitaxial layer, wherein the liner region includes electrons from an n-doped dielectric liner and has higher n-type doping concentrations than portions of the n-minus substrate layer, the n-plus buried layer, and the epitaxial layer adjacent the liner region.

18. The integrated circuit of claim 17, wherein the deep trench isolation region includes the n-doped dielectric liner.

* * * * *